United States Patent
Chu et al.

[11] Patent Number: 6,144,013
[45] Date of Patent: Nov. 7, 2000

[54] LOCAL HUMIDITY CONTROL SYSTEM FOR LOW TEMPERATURE ELECTRONIC MODULE

[75] Inventors: Richard C. Chu, Poughkeepsie; Michael J. Ellsworth, Jr., Lagrangeville; Robert E. Simons, Poughkeepsie, all of N.Y.

[73] Assignee: International Business Machines Corporation, Armonk, N.Y.

[21] Appl. No.: 09/346,382

[22] Filed: Jul. 1, 1999

[51] Int. Cl.[7] .................................................. H05B 1/00
[52] U.S. Cl. .......................................... 219/209; 392/416
[58] Field of Search .................................. 219/209, 210, 219/444.1, 530, 531, 540, 542, 543, 544, 546, 548, 399, 405; 392/416, 418; 34/557

[56] References Cited

U.S. PATENT DOCUMENTS

| | | | |
|---|---|---|---|
| 4,277,742 | 7/1981 | Kovac et al. | 219/209 |
| 4,568,277 | 2/1986 | MacInnes et al. | 219/210 |
| 4,777,434 | 10/1988 | Miller et al. | 219/210 |
| 5,025,228 | 6/1991 | Gerard et al. | 219/210 |
| 5,059,770 | 10/1991 | Mahawili | 219/444.1 |
| 5,148,003 | 9/1992 | Haj-Ali-Ahmadi et al. | 219/209 |
| 5,539,186 | 7/1996 | Abrami et al. | 219/548 |
| 5,574,627 | 11/1996 | Porter | 219/209 |
| 5,645,123 | 7/1997 | Doi et al. | 219/209 |
| 5,767,489 | 6/1998 | Ferrier | 219/209 |
| 5,844,208 | 12/1998 | Tustaniwskyj et al. | 219/209 |
| 5,854,468 | 12/1998 | Muka | 219/444.1 |
| 5,855,675 | 1/1999 | Doering et al. | 219/444.1 |
| 5,904,872 | 5/1999 | Arami et al. | 219/444.1 |
| 5,911,897 | 6/1999 | Hamilton | 219/209 |
| 5,917,272 | 6/1999 | Clark et al. | 219/210 |

Primary Examiner—Teresa Walberg
Assistant Examiner—Fadi H. Dahbour
Attorney, Agent, or Firm—Lily Neff, Esq.; Heslin & Rothenberg, P.C.

[57] ABSTRACT

A local humidity control system and method are provided for a low temperature electronic device assembly wherein a surface of the low temperature electronic device assembly is maintained above an ambient dew point. The local humidity control system includes a first layer of thermal insulation at least partially surrounding and contacting the cooled electronic device, and a second layer of thermal insulation surrounding the first layer of thermal insulation and the cooled electronic device in which a volume is defined between the first and second layers of insulation. A heater assembly interfaces with the volume to heat the volume to a temperature sufficient to maintain the surface of the cooled electronic device above the ambient dew point. The heater assembly includes a thin film heater attached to the first layer of thermal insulation to maintain temperature of the surface above the ambient dew point, and a wire mesh heater suspended within the volume to lower relative humidity in the volume and inhibit the ingress of water vapor.

20 Claims, 2 Drawing Sheets

6,144,013

LOCAL HUMIDITY CONTROL SYSTEM FOR LOW TEMPERATURE ELECTRONIC MODULE

TECHNICAL FIELD

This invention generally relates to electronic modules, and more specifically, to a local humidity control system and method for a low temperature electronic module such as a cooled multichip integrated circuit module.

BACKGROUND OF THE INVENTION

A wide variety of electronic devices exist in the art. These electronic devices may comprise packaged integrated circuit chips, or bare chips which are unpackaged. Further, multiple integrated circuit chips can be integrated into a single multichip module. Any type of circuitry can be integrated into the chips, such as digital logic circuitry or memory circuitry or analog circuitry. Also, the circuitry in the chips can be comprised of any type of transistors, such as field effect transistors or bi-polar transistors.

One reason for trying to lower the temperature of an electronic module is that its operation may be temperature dependent. For example, a chip comprised of complementary field effect transistors (CMOS transistors) typically increases its speed of operation by approximately 0.3% per ° C. drop in chip temperature.

Thus, in order to increase the performance of CMOS based computers, it is advantageous to reduce the operating temperature of the chips substantially. In doing so, however, applicants have discovered that in reducing surfaces of the module below a room air dew point temperature, water vapor will condense on the exposed surfaces. Similarly, the temperature of the air in the vicinity of the module will decrease because of a cooling effect of the cold air surfaces nearby. This will result in an increase in the relative humidity of the air near the module and could adversely effect device reliability. Therefore, there exists a need in the art for a local humidity control system for a low temperature electronic module.

DISCLOSURE OF THE INVENTION

Briefly summarized, the present invention comprises in one aspect a local humidity control system for maintaining a surface of a cooled electronic device above a dew point. The local humidity control system includes a first layer of thermal insulation at least partially surrounding and contacting the cooled electronic device, as well as a second layer of thermal insulation surrounding the first layer of thermal insulation and the cooled electronic device. The second layer of thermal insulation surrounds the first layer of thermal insulation so as to create a volume between the first and second layers. The local humidity control system further includes a heater assembly disposed for heating the volume to a temperature sufficient to maintain the surface of the cooled electronic module above the dew point.

In another aspect, an electronic device assembly is provided which includes a cooled electronic device, and a first layer of thermal insulation at least partially surrounding and contacting the cooled electronic device. A second layer of thermal insulation surrounds the first layer of thermal insulation and the cooled electronic device such that a volume is defined between the first and second layers of insulation. A heater assembly is disposed for heating the volume to a temperature sufficient to maintain a surface of the cooled electronic device above an ambient dew point.

In still another aspect, an electronic device assembly is provided which includes an electronic module having at least one integrated circuit chip. The device assembly further includes a cold plate thermally coupled to the electronic module for cooling the at least one integrated circuit chip, and a local humidity control system surrounding and at least partially contacting the electronic module for maintaining a surface of the electronic module above an ambient dew point.

In a further aspect, a method for fabricating a cooled electronic device is provided. This method includes: providing the electronic device; thermally coupling a cold plate to the electronic device; providing a first layer of thermal insulation at least partially surrounding the electronic device; providing a second layer of thermal insulation surrounding the first layer of thermal insulation and spaced therefrom to define a volume therebetween; and disposing a heater assembly within the volume for heating the volume to a temperature sufficient to maintain a surface of the cooled electronic device above an ambient dew point temperature.

To restate, provided herein is a local humidity control system for a low temperature electronic module such as a multichip module comprised of CMOS-based integrated circuit chips. The low temperature electronic module is cooled in one example by a refrigeration evaporative cold plate. First and second layers of thermal insulation are provided about an edge of the electronic module with an air volume defined between the layers. At least one heater, and preferably multiple heaters, are disposed within the air volume to maintain the temperature of the air volume above an ambient dew point temperature. In one embodiment, a thin film heater is attached to the first layer of thermal insulation for maintaining the surface of the first layer of thermal insulation above the ambient dew point, and a wire mesh heater is suspended in the volume to lower the relative humidity of the volume and inhibits the ingress of water vapor from the ambient room.

Advantageously, by cooling the electronic module improved performance is achieved, particularly for CMOS-based integrated circuit chips. Condensation due to attaching a cold plate to the module surface is eliminated by providing the local humidity control system described above, thereby preventing a shortening of the life of the electronic module, as well as any printed circuit board to which it is attached, thus ensuring module and board reliability.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

BEST MODE FOR CARRYING OUT THE INVENTION

Generally stated, presented herein is a system and method for providing local humidity control for a low temperature electronic module. The low temperature electronic module includes in one embodiment an evaporator cold plate attached to the electronic device, which may contain a multiplicity of integrated circuit chips. Alternatively, the electronic module could comprise a single integrated circuit chip.

In one embodiment, a layer of insulation is attached to and surrounds the evaporator cold plate and contacts the edges of the electronic module. Sufficient clearance is provided between the side of the module and adjacent walls of the cold plate insulation to allow the cold plate to be readily attached to or removed from the module. When the cold plate is attached to the module, room air is trapped in the volume between the cold plate insulation and the module. Thus, in order to prevent water vapor condensation on the module side walls, a (thin) layer of thermal insulation is preferably attached to the side walls of the module. Additionally, a thin film heater is attached to an exposed surface of the thin layer of insulation to maintain the surface above the dew point. The "dew point" comprises the temperature below which moisture will condense out of air. Air that is holding as much waver vapor as possible is saturated or at is dew point. Water will condense on a surface, such as a building wall or pitcher of ice water, that is at or below the dew point temperature of the air. A wire mesh heater can also be provided to lower the relative humidity of the trapped air volume and inhibit the ingress of water vapor from the ambient room. The heater is physically supported by the cold plate insulation layer and is suspended in the air volume.

Figure 1:
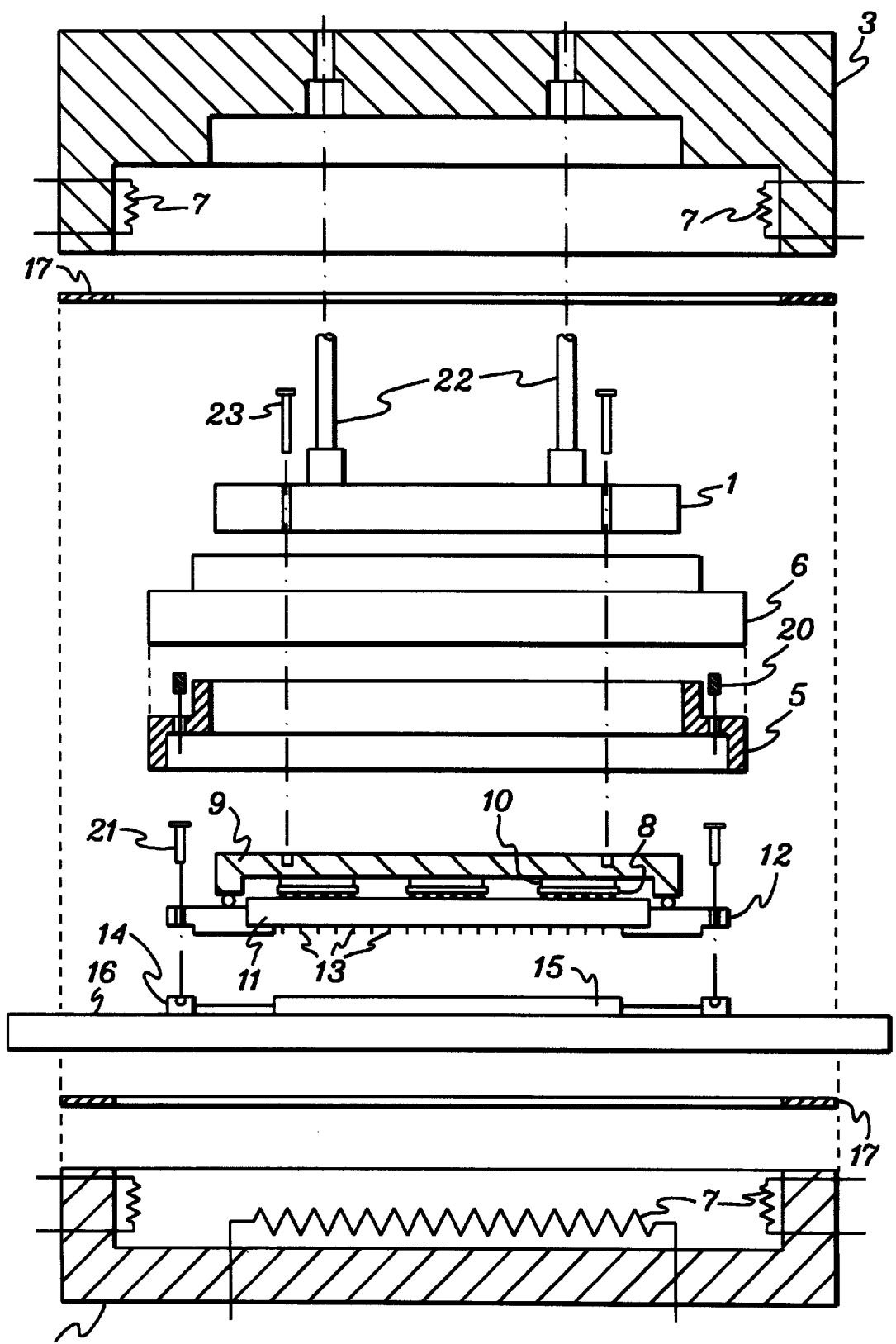
FIG. 1 is an exploded elevational view of an electronic device assembly in accordance with the principles of the present invention, wherein the electronic device assembly comprises an electronic module, a cold plate, and a local humidity control system, all of which connect to a printed circuit board.
Figure 2:
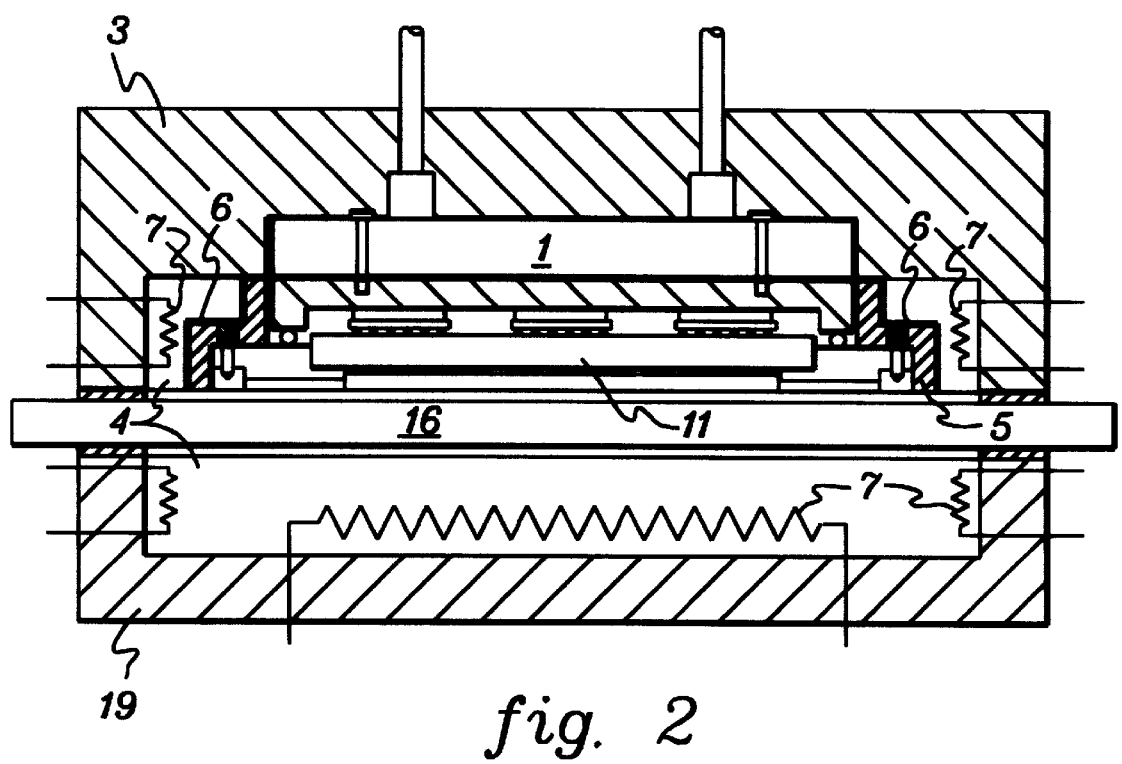
FIG. 2 is an elevational view illustrating the assembled electronic device assembly of FIG. 1.

More particularly, FIGS. 1 & 2 provide one detailed embodiment of an electronic device assembly in accordance with the principles of the present invention.

FIG. 1 is an exploded, cross-sectional, profile view of a module and board assembly with the insulative structures, heaters, and seals employed by the invention.

Elements 8, 9, 10, 11, 12, and 13 together form an electronic processor module assembly which it is desirable to maintain at low temperature with the object of improving circuit speed performance and reliability. As noted, the electronic module 2 could alternatively comprise a single entity. High performance integrated circuit chips 8 are attached to a glass/metal substrate 11 by means of electrically interconnecting solder pads (not labeled). A thermal path for heat flow from the chips is provided to the metal cap 9 by means of thermally conductive paste pads 10 in physical contact with the back of the chips 8 and the inner wall of the cap 9. The substrate 11 is mechanically captivated between a baseplate 12 and the side walls of the cap 9. A seal (not labeled) is provided between the top of the baseplate 12 and the perimeter walls of the cap 9 to isolate the chips 8 and associated top surface metallurgy from the exterior environment.

The module assembly is plugged into an electrical connector 15 joined to the printed circuit board 16. Paths for transfer of electrical signals and power between the printed circuit board 16 and connector 15 to the module substrate 11 are provided by means of electrically conductive pins 13 joined to the bottom of the substrate 11. A metal stiffener 14 is attached to the printed circuit board 16 to provide the requisite degree of structural rigidity and to provide the means of locking the module into position via mechanical bolts 21 arranged uniformly around the perimeter of the baseplate 12. A cold plate 1 is attached to the top surface of the module cap 9 by means of mechanical bolts 23 for the purpose of cooling the electronic module. Fluid transfer hoses 22 are attached to the cold plate 1 to provide entry and exit of cooling fluid.

The cooling fluid flowing through the cold plate may be water or other suitable liquid coolant. For operation below the freezing point of water a suitable antifreeze solution may be added to the water. The cold plate may also be operated as the evaporator of a refrigeration cooling system by passing a refrigerant through the cold plate and allowing it to boil.

Packages such as that already described are used today in IBM servers and in some cases are cooled by a refrigeration cooling system as discussed in the preceding paragraph. However, it is important to note that it has been necessary to operate the electronic module at a temperature above the room dew point to ensure that no water vapor will condense on the exposed cap 9, substrate 11, baseplate 12, pin 13, connector 15, stiffener 14, and printed circuit board 16 surfaces. As the temperatures of the chips 8 are lowered below the dew point to obtain improved circuit performance, the aforementioned exposed surfaces will all become cooler due to heat conduction to the "cold" chips 8, cap 9, and cold plate 1, and they will experience "sweating" or condensation of water vapor.

The elements of FIGS. 1 & 2 which are particular to the present invention are next described below.

A thermally insulative structure 5 becomes part of the module assembly and surrounds the module cap 9 and baseplate 12 surfaces. As may be seen in FIG. 1, when the module assembly is attached to the board 16 the insulative structure 5 also surrounds the exposed stiffener 14 surfaces. Removable thermally insulative plugs 20 are provided for the purpose of allowing access to attachment bolts 21. An electrical film heater cover 6 is adhesively bonded to the side walls of the thermally insulative structure 5. The heater is used to elevate the exposed side walls above the dew point temperature while the insulative wall structure is used to minimize heat leakage into the "cold" baseplate 12, cap 9, stiffener 14, and cold plate 1. The top of the thermally insulative structure 5 and its surrounding heater cover 6 is open to allow thermally intimate attachment of the cold plate to the cap surface.

Externally thermally insulative structures 3 and 19 are provided for attachment to the module side and reverse side of the printed circuit board 16, respectively. The thermally insulative structure 3 attached to the module side of the printed circuit board 16 is affixed in such a manner as to allow ease of removal or replacement of a defective module assembly. Elastomeric or other suitable gasket seals 17 are provided between the two external thermally insulative structures 3 and 19 and the board surface to which they are attached. The purpose of said seals is to prevent easy ingress of moist air from the outside room. Heater assemblies 7 are suspended from the inner walls of the external insulative structures 3 and 19. These heaters are intended to heat the air trapped within the confined volumes 4 to drive out water vapor, prevent ingress of water vapor from the outside environment, and assist in heating internal wall surfaces above the dew point within the trapped air volume. Thermal insulation 3, 5, and 19 can be made of a variety of materials and/or structures. Structurally, insulation falls into two general categories: evacuated (vacuum) or unevacuated. Evacuated insulations are more difficult (i.e., costly) to implement, and are typically reserved for systems at very low temperatures (77 K and below). From a materials standpoint, insulations can be made out of powders, fibers, foams, cork, etc. Insulation thickness will vary from application to application and will primarily depend on the space available for insulation and the temperatures being insulated. For insulation structures and 19, thickness can be on the order of 1–2 inches (25–50 mm). Insulation structure 5 is a bit more confined, so a thickness on the order of ⅜" (10 mm) is desirable.

The second layer of insulation 3, 19 is required to confine electronics surfaces that are otherwise impossible to cover with the first layer of insulation 5. An example of uncovered surfaces would be in the region directly below the module where the electrical connection is made between the module and the board. The space (volume) that is formed between the first and second insulation is a natural fallout. The present invention is intended to utilize this space to advantage.

The thin film 6 and wire mesh heaters 7 work together to provide the necessary function in a way that is more desirable than if done with either heater alone. Keeping the inner surfaces above dew point and heating the air space above the surrounding ambient can be done with either heater but it would require more power to satisfy both functions and would result in certain temperatures to be much higher than dew point to heat the air space above the surrounding ambient. Conversely, if only the wire mesh heater were used, the air space would have to be heated to a temperature much higher than necessary to keep the inner surface temperatures above the dew point.

The theory of operation of the above-described embodiment of the present invention is described further below.

The kinetic theory for the mass flux of one component in a multi-component mixture of low density, simple gases (see, for example, Hirschfelder, J. O., Curtiss, C. F., and Bird, R. B., "Molecular Theory of Gases and Liquids," Wiley, New York, 1954) can be used to explain how water vapor is driven out and how water vapor from the surrounding environment is prevented from entering the confined volume. Also, a distinction needs to be made between mass that is transferred across a boundary by convection, or bulk fluid movement, and mass that is transferred across a boundary by diffusion which is caused by potential gradients acting on the system such as temperature, pressure, and mass concentration. The latter is due primarily to the action of the gasses at the molecular level. When the suspended heaters are turned on initially, both the pressure and temperature of the gas mixture (air and water vapor) in the confined space rise above that of the surroundings. Since the seal 17 is not perfect, the gases inside the confined space will leak out to the surroundings until the pressure between the two spaces is equalized. This bulk transfer of the gases produces the desired result of water vapor being driven out of the confined space. At this point, mass transfer by diffusion is predominant. All other things being equal, water vapor would transfer into the confined space if the concentration of water vapor were higher in the surroundings. But since the temperature inside the confined space is higher than that of the surroundings, a potential gradient is established that opposes the concentration gradient thus preventing water vapor from entering the confined space over time.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A local humidity control system for maintaining a surface of a cooled electronic device above an ambient dew point, said local humidity control system comprising:

a first layer of thermal insulation at least partially surrounding and contacting the cooled electronic device;

a second layer of thermal insulation surrounding the first layer of thermal insulation and the cooled electronic device in which a closed volume comprising trapped air is defined between the first and second layers of thermal insulation; and a heater assembly for heating said closed volume to a temperature sufficient to maintain the surface of said cooled electronic device above said ambient dew point.

2. The local humidity control system of claim 1, wherein the cooled electronic device comprises a cold plate.

3. The local humidity control system of claim 1, wherein the heater assembly comprises a thin film heater attached to said first layer of thermal insulation for maintaining a surface of said first layer of thermal insulation above said ambient dew point.

4. The local humidity control system of claim 1, wherein the cooled electronic device comprises a multichip module and a cold plate thermally coupled to the multichip module, and wherein said first layer of thermal insulation at least partially surrounds and contacts an edge of the multichip module.

5. A local humidity control system for maintaining a surface of a cooled electronic device above an ambient dew point, said local humidity control system comprising:

a first layer of thermal insulation at least partially surrounding and contacting the cooled electronic device;

a second layer of thermal insulation surrounding the first layer of thermal insulation and the cooled electronic device in which a volume is defined between the first and second layers of thermal insulation; and a heater assembly for heating said volume to a temperature sufficient to maintain the surface of said cooled electronic device above said ambient dew point, wherein the heater assembly comprises a thin film heater attached to said first layer of thermal insulation for maintaining a surface of said first layer of thermal insulation above said ambient dew point, and wherein the heater further comprises a wire mesh heater suspended in the volume to lower relative humidity in the volume and inhibit the ingress of water vapor.

6. The local humidity control system of claim 5, wherein the cooled electronic device comprises an electronic module and a cold plate thermally coupled to a planar main surface of the electronic module, and wherein said first layer of thermal insulation comprises a layer of thermal insulation surrounding and contacting an edge of said electronic module.

7. The local humidity control system of claim 6, wherein said electronic module comprises a multichip module, said multichip module residing on a printed circuit board, and wherein said second layer of thermal insulation comprises a first external thermally insulative structure attached to a module side of the printed circuit board and surrounding the multichip module, said volume comprising a first volume defined between said first external thermally insulative structure and said first layer of thermal insulation.

8. The local humidity control system of claim 7, wherein said wire mesh heater is physically supported by said first external thermally insulative structure and suspended within said first volume.

9. The local humidity control system of claim 8, wherein said wire mesh heater assembly comprises multiple wire mesh heaters suspended within said first volume.

10. The local humidity control system of claim 7, wherein said second layer of thermal insulation further comprises a second external thermally insulative structure surrounding an underside of said printed circuit board in which a second volume is defined between the second external thermally insulative structure and the underside of the printed circuit board, and wherein said wire mesh heater assembly comprises multiple wire mesh heaters suspended within said second volume, said multiple wire mesh heaters being physically supported by said second external thermally insulative structure.

11. An electronic device assembly comprising:

a cooled electronic device;

a first layer of thermal insulation at least partially surrounding and contacting the cooled electronic device;

a second layer of thermal insulation surrounding the first layer of thermal insulation and the cooled electronic device in which a closed volume comprising trapped air is defined between the first and second layers of thermal insulation; and a heater assembly for heating said closed volume to a temperature sufficient to maintain a surface of the cooled electronic device above an ambient dew point.

12. An electronic device assembly comprising:

a cooled electronic device;

a first layer of thermal insulation at least partially surrounding and contacting the cooled electronic device;

second layer of thermal insulation surrounding the first layer of thermal insulation and the cooled electronic device in which a volume is defined between the first and second layers of thermal insulation;

a heater assembly for heating said volume to a temperature sufficient to maintain a surface of the cooled electronic device above an ambient dew point; and wherein said heater assembly comprises a wire mesh heater suspended in said volume to lower relative humidity in the volume and inhibit the ingress of water vapor.

13. The electronic device assembly of claim 12, wherein said heater assembly further comprises a thin film heater attached to said first layer of thermal insulation for maintaining a surface of said first layer of thermal insulation above said ambient dew point.

14. The electronic device assembly of claim 13, wherein said cooled electronic device comprises an electronic module and a cold plate thermally coupled to a planar main surface of the electronic module, and wherein said first layer of thermal insulation comprises a layer of thermal insulation surrounding and contacting an edge of said electronic module.

15. The electronic device assembly of claim 14, wherein said electronic module comprises a multichip module.

16. An electronic device assembly comprising:

an electronic module comprising at least one integrated circuit chip;

a cold plate thermally coupled to said electronic module for cooling said at least one integrated circuit chip;

a local humidity control system surrounding and at least partially contacting said electronic module for maintaining a surface of said electronic module above an ambient dew point, wherein said local humidity control system comprises a first layer of thermal insulation at least partially surrounding and contacting the electronic module, and a second layer of thermal insulation surrounding the first layer of thermal insulation and the electronic module, wherein a closed volume comprising trapped air is defined between the first and second layers of thermal insulation; and a heater assembly for heating said closed volume to a temperature sufficient to maintain a surface of the electronic module above an ambient dew point.

17. A method for fabricating an electronic device assembly, said method comprising:

providing an electronic module;

thermally coupling a cold plate to the electronic module;

providing a first layer of thermal insulation at least partially surrounding the electronic module;

providing a second layer of thermal insulation surrounding the first layer of thermal insulation and spaced therefrom to define a closed volume comprising trapped air therebetween; and disposing a heater assembly within said volume for heating said volume to a temperature sufficient to maintain a surface of the electronic module above an ambient dew point.

18. The method of claim 17, wherein said providing of said first layer of thermal insulation comprises providing a layer of thermal insulation surrounding and contacting an edge of said electronic module, and wherein said disposing of said heater assembly comprises providing a thin film heater attached to said first layer of thermal insulation for maintaining a surface of said first layer of thermal insulation above said ambient dew point.

19. The method of claim 17, wherein said disposing of said heater assembly comprises providing a wire mesh heater suspended within said volume to lower relative humidity in the volume and inhibit the ingress of water vapor, said wire mesh heater being supported by said second layer of thermal insulation.

20. A method for fabricating an electronic device assembly, said method comprising:

providing an electronic module;

thermally coupling a cold plate to the electronic module;

providing a first layer of thermal insulation at least partially surrounding the electronic module;

providing a second layer of thermal insulation surrounding the first layer of thermal insulation and spaced therefrom to define a volume therebetween;

disposing a heater assembly within said volume for heating said volume to a temperature sufficient to maintain a surface of the electronic module above an ambient dew point;

wherein said providing of said first layer of thermal insulation comprises providing a layer of thermal insulation surrounding and contacting an edge of said electronic module, and wherein said disposing of said heater assembly comprises providing a thin film heater attached to said first layer of thermal insulation for maintaining a surface of said first layer of thermal insulation above said ambient dew point; and wherein said disposing of said heater assembly within said volume further comprises disposing a wire mesh heater suspended within said volume to lower relative humidity in the volume and inhibit the ingress of water vapor, said wire mesh heater being supported by said second layer of thermal insulation.

* * * * *